(12) United States Patent
Harrington et al.

(10) Patent No.: US 9,419,166 B2
(45) Date of Patent: Aug. 16, 2016

(54) ETCHING PROCESSES FOR SOLAR CELL FABRICATION

(71) Applicants: Scott Harrington, Oakland, CA (US); Venkatasubramani Balu, Santa Clara, CA (US); Westerberg Staffan, Sunnyvale, CA (US); Peter John Cousins, Los Altos, CA (US)

(72) Inventors: Scott Harrington, Oakland, CA (US); Venkatasubramani Balu, Santa Clara, CA (US); Westerberg Staffan, Sunnyvale, CA (US); Peter John Cousins, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/975,175

(22) Filed: Dec. 18, 2015

(65) Prior Publication Data

US 2016/0111583 A1   Apr. 21, 2016

Related U.S. Application Data

(63) Continuation of application No. 14/498,850, filed on Sep. 26, 2014, now Pat. No. 9,246,046.

(51) Int. Cl.
*H01L 21/00* (2006.01)
*H01L 31/18* (2006.01)

(52) U.S. Cl.
CPC ................................ *H01L 31/1804* (2013.01)

(58) Field of Classification Search
CPC ............ H01L 31/1804; H01L 31/0682; H01L 31/022441; H01L 31/02363; H01L 31/068; H01L 31/022425
See application file for complete search history.

(56) References Cited

U.S. PATENT DOCUMENTS

| | | | |
|---|---|---|---|
| 2009/0142875 A1 | 6/2009 | Borden et al. | |
| 2009/0308457 A1 | 12/2009 | Smith | |
| 2010/0068886 A1 | 3/2010 | Yu et al. | |
| 2014/0034119 A1* | 2/2014 | Lee | H01L 31/076 136/255 |
| 2014/0034122 A1 | 2/2014 | Cousins | |

FOREIGN PATENT DOCUMENTS

WO   WO-2013169208   11/2013

OTHER PUBLICATIONS

International Search Report and Written Opinion for PCT Patent Application No. PCT/US2015/051786 mailed Feb. 23, 2016, 16 pgs.
Notice of Allowance and Fees for U.S. Appl. No. 14/498,850 mailed Sep. 15, 2015, 10 pgs.

* cited by examiner

*Primary Examiner* — Tony Tran
(74) *Attorney, Agent, or Firm* — Blakely Sokoloff Taylor Zafman LLP

(57) ABSTRACT

A method of fabricating a solar cell can include forming a first dopant region over a silicon substrate and an oxide region over the first dopant region. In an embodiment, the oxide region can protect the first dopant region from a first etching process. In an embodiment, a second dopant region can be formed over the silicon substrate, where a mask can be formed to protect a first portion of the second dopant region from the first etching process. In an embodiment, the first etching process can be performed to expose portions of the silicon substrate and/or a silicon region. A second etching process can be performed to form a trench region to separate a first and second doped region of the solar cell. A third etching process can be performed to remove contaminants from the solar cell and remove any remaining portions of the oxide region.

4 Claims, 3 Drawing Sheets

ETCHING PROCESSES FOR SOLAR CELL FABRICATION

CROSS-REFERENCE TO RELATED APPLICATIONS

This application is a continuation of U.S. patent application Ser. No. 14/498,850, filed on Sep. 26, 2014, the entire contents of which are hereby incorporated by reference herein.

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to P-doped and N-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collect from all of the PV cells can be combined in series and parallel arrangements to provide power with a certain voltage and current.

Efficiency is an important characteristic of a solar cell as it is directly related to the solar cell's capability to generate power. Accordingly, techniques for improving the fabrication process, reducing the cost of manufacturing and increasing the efficiency of solar cells are generally desirable.

DETAILED DESCRIPTION

Figure 1:
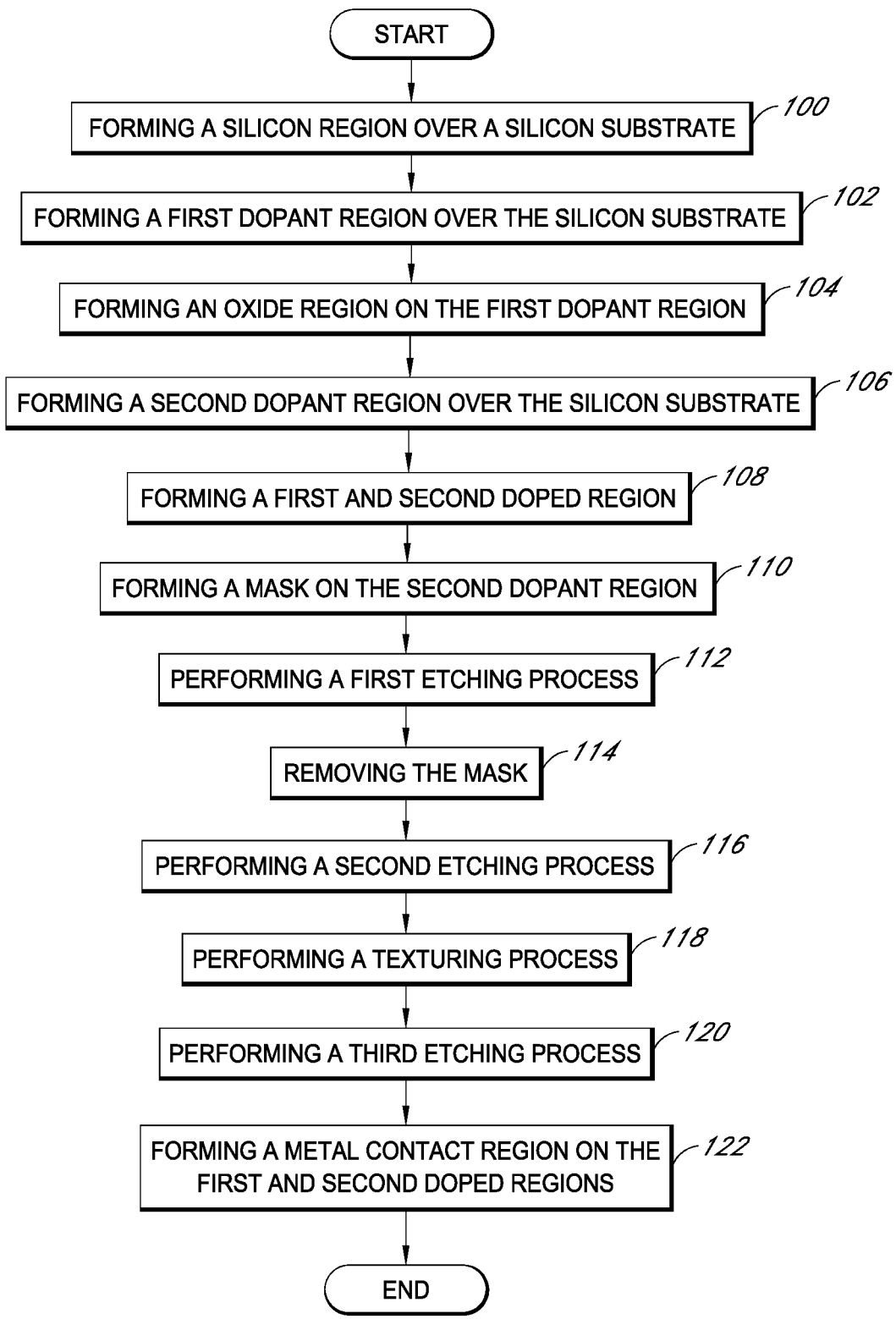
FIG. 1 illustrates a flow chart representation of a method of fabricating a solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" etching process does not necessarily imply that this etching process is the first etching process in a sequence; instead the term "first" is used to differentiate this etching process from another etching process (e.g., a "second" etching process).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes example method of fabricating a solar cell including improved etching processes for forming P-doped and N-doped regions, followed by a more detailed explanation of various embodiments of etching processes for solar cell fabrication. Various examples are provided throughout.

Turning now to FIG. 1, a flow chart illustrating a method for fabricating a solar cell is shown, according to some embodiments. In various embodiments, the method of FIG. 1 can include additional (or fewer) blocks than illustrated. For example, in some embodiments, a second etching process (block 116) need not be performed.

At 100, a silicon region can be formed over a silicon substrate. In an embodiment, the silicon region can be amorphous silicon and/or polysilicon. In some embodiments, the silicon region can be deposited or grown in a thermal process (e.g., in an oven or a thermal chamber). In an embodiment, a dielectric region can be formed over the silicon substrate prior to forming the silicon region. In some embodiments, the dielectric region can be an oxide or a tunnel oxide. In some embodiments, the silicon region need not be formed. In such embodiments, as described herein, dopants can be driven into the silicon substrate itself.

At 102, a first dopant region can be formed over the silicon substrate. In an embodiment, the first dopant region can be formed on the silicon region. In some embodiments, the first dopant region can be formed on the silicon substrate. In an embodiment, the first dopant region can be deposited through a chemical vapor deposition process (CVD) and/or a plasma enhanced chemical vapor deposition process (PECVD). In an embodiment, the first dopant region can include a P-type dopant, for example boron.

At 104, an oxide region can be formed on the first dopant region. In one embodiment, the oxide region can be an undoped oxide region. In an embodiment, the oxide region can have a thickness in the range of 1000-2500 Angstroms. In an embodiment, the oxide region can be deposited through a chemical vapor deposition process (CVD) and/or a plasma enhanced chemical vapor deposition process (PECVD). In some embodiments, the oxide region can be formed in the same process step (block 102) as the first dopant region, e.g., blocks 102 and 104 can be performed in the same process (whether simultaneous or just within the same process but not simultaneous).

At 106, a second dopant region can be formed over the silicon substrate. In an embodiment, the second dopant region can be formed on the silicon region. In some embodiments, the second dopant region can be formed on the silicon substrate. In one embodiment, the second dopant region can be formed over the first dopant region. In an embodiment, the second dopant region can be deposited through a chemical vapor deposition process (CVD) and/or a plasma enhanced chemical vapor deposition process (PECVD). In one embodiment, the second dopant region can be grown (e.g., in a thermal oven or through a thermal process). In an embodiment, the second dopant region can include a N-type dopant, such as phosphorus. In one embodiment, an oxide region can also be formed on the second dopant region.

Figure 2:
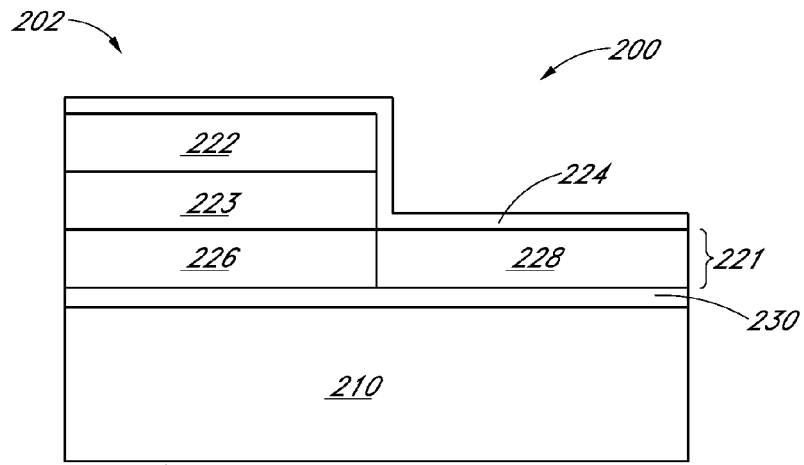
FIGS. 2-7 illustrate cross-sectional views of a solar cell at various processing steps, according to some embodiments.

At 108, first and second doped regions can be formed. In one embodiment, the first and second doped regions can be formed in the silicon region. In some embodiments, the first and second doped region can be formed in the silicon substrate. In one embodiment, the first and second doped regions can be P-type and N-type doped regions, respectively. In an embodiment, the first and second doped regions can be formed by driving dopants from the first and second dopant regions into the silicon region, silicon substrate or both the silicon region and silicon substrate. In one example, the solar cell can be heated to drive dopants from the first and second dopant regions into the silicon region to form the first and second doped regions. In some embodiments, forming the second dopant region and driving dopants from the first and second dopant region to form the first and second doped regions can be performed in a single thermal oven and/or thermal process (whether simultaneous or just within the same process but not simultaneous). FIG. 2, as described in more detail below, shows an example solar cell after forming a dielectric region, first and second doped regions, first and second dopant regions and an oxide region.

Figure 3:
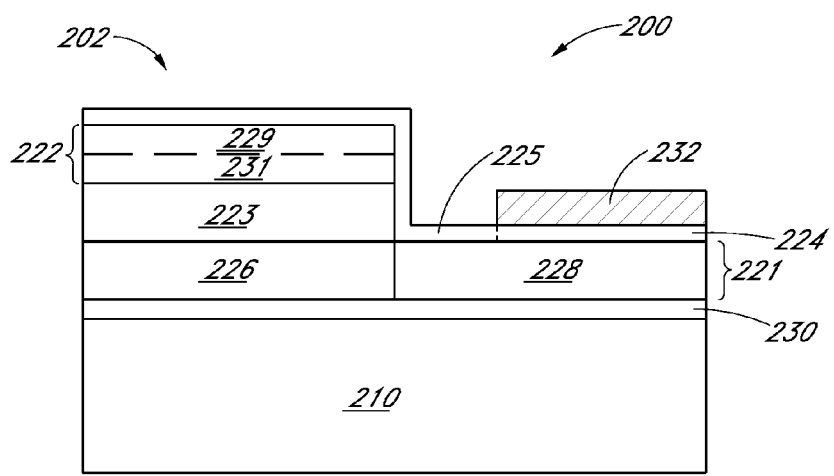

At 110, a mask can be formed on the second dopant region. In an embodiment, the mask can be formed over a first portion of the second dopant region. In some embodiments, the mask can be an etch resist or an ink. In one embodiment, the mask can be formed by a screen printing process and/or an inkjet process. FIG. 3, as described in more detail below, shows an example silicon substrate after forming the mask 232 on a first portion of the second dopant region.

At 112, a first etching process can be performed. In an embodiment, the first etching process can include partially removing the oxide region. In an example, the oxide region can act as an etch-stop and/or a mask to inhibit etching of the first dopant region during the first etching process. A benefit to using the oxide region as an etch-stop and/or mask can include reducing or eliminating the need for an etch resist typically required for an etching process, which can result in fewer materials (e.g., less etch resist or ink) and therefore reduced fabrication cost.

As an example of the oxide region acting as an etch-stop or mask, in one embodiment, a top portion of the oxide region can protect the first dopant region from the first etching process. In an embodiment, the top portion of the oxide region can be removed during the first etching process. In some embodiments, the first etching process can etch and/or remove 55-90% of the oxide region. In an embodiment, a remaining portion of the oxide region can be left on the first dopant region after performing the first etching process. In one embodiment, the remaining portion of the oxide region can have thickness of 200-900 Angstroms. In an embodiment, a top portion of the oxide region can be etched away after the first etching process. In some embodiments, the region etched away (e.g., the top portion) can be 600-1900 Angstroms thick. In an embodiment, the top portion and remaining portion can be referred to as a first and second portion of the oxide region respectively.

Figure 4:
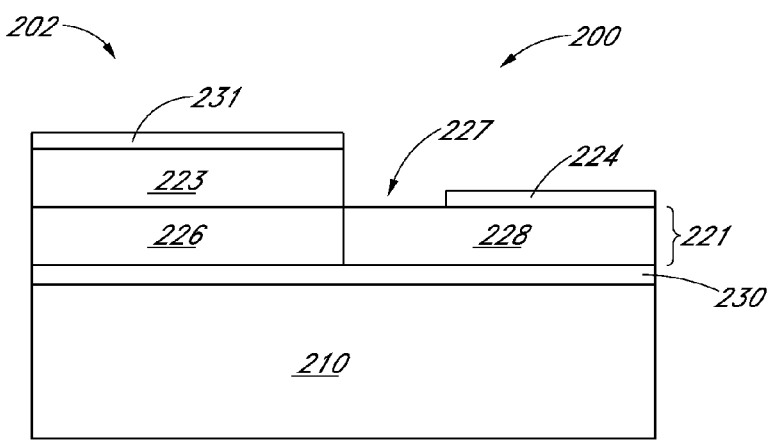

In an embodiment, performing the first etching process can include exposing a portion of the silicon substrate. In one embodiment, performing the first etching process can include exposing a portion of the silicon region. In an embodiment, the first etching process can remove an exposed region a of the second dopant region. FIG. 4, for example, shows a silicon substrate after performing a first etching process, where a portion 227 of the silicon region is exposed.

In some embodiments, the mask (from block 110) can protect a first portion of the second dopant region during the first etching process. In one embodiment, the first etching process can be controlled over time, e.g., performing a timed oxide etch with a dilute hydrofluoric acid or buffered oxide etch solution, to expose a portion of the silicon substrate. In an embodiment, an etching process with hydrofluoric acid and/or nitric acid can be used to expose a portion of the silicon substrate. In some embodiments, the first etching process can remove any oxide formed over the second dopant region and can partially remove oxide formed over the first dopant region.

At 114, the mask (from block 110) can be removed from the second dopant region. In an embodiment, the mask can be an etch resist or an ink. In one embodiment, an ink-strip process can be performed to remove the mask.

Figure 5:
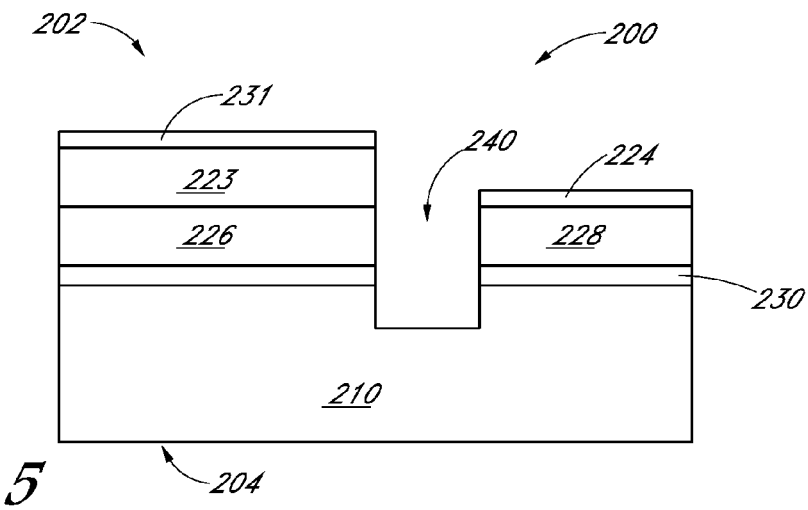

At 116, a second etching process can be performed. In an embodiment, performing the second etching process can include forming a trench region to separate the first and second doped regions (block 108). FIG. 5 shows a solar cell after forming a trench region 240. In an embodiment, the trench region can electrically separate the first and second doped regions. In an embodiment, the trench region can expose a portion the silicon substrate. In one embodiment, with reference to FIG. 5, the remaining portion 231 of the oxide region can protect the first dopant region from the second etching process. In an embodiment, an alkaline etchant (e.g., potassium hydroxide, sodium hydroxide, tetramethylammonium hydroxide) can be used to etch the silicon substrate and form the trench region. In an embodiment, the second etching process can be controlled over time, e.g., performing a timed oxide etch, to expose a portion of the silicon substrate. In some embodiments, such as where first and second doped regions are formed in the silicon substrate, the second etching process and/or the trench region need not be formed.

Figure 6:
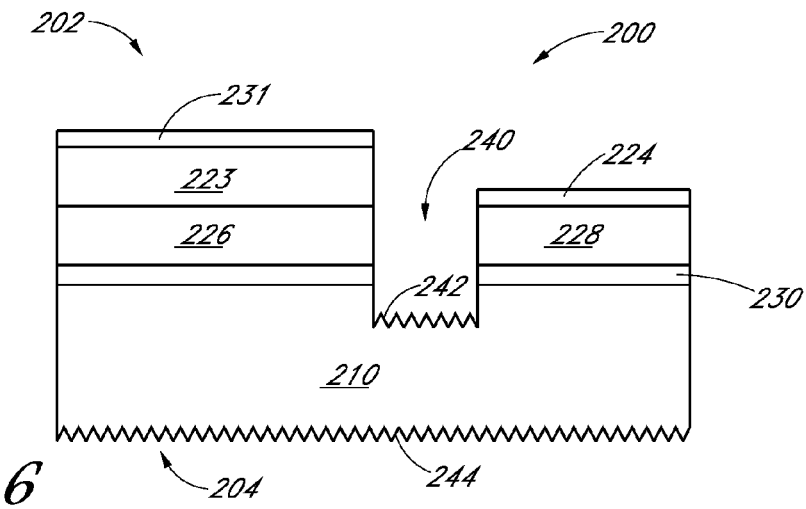

At 118, a texturing process can be performed. In an embodiment, the texturing process can form a textured region on exposed regions of the silicon substrate. FIG. 6, for example, shows a silicon substrate after texturing and forming a textured surface on the exposed regions (e.g., on a front surface) and trench region of the silicon substrate. In one embodiment, potassium hydroxide can be used to form a textured surface on the trench region and exposed regions of the silicon substrate.

Figure 7:
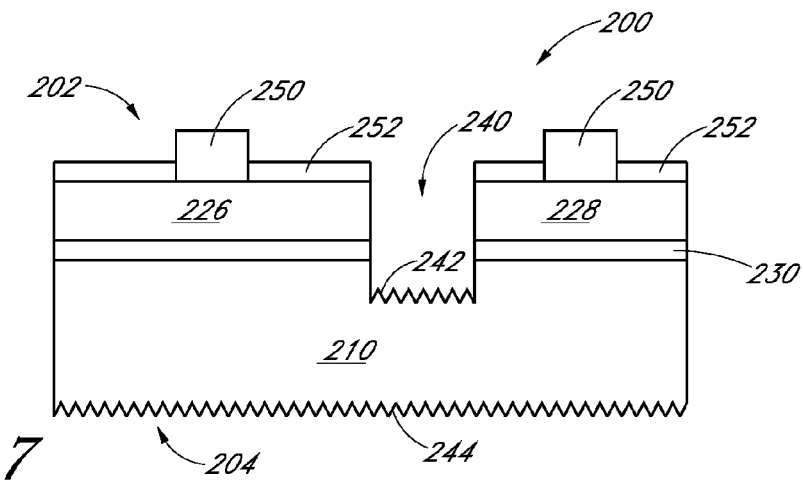

At 120, a third etching process can be performed on the silicon substrate. In an embodiment, performing the third etching process can include removing the first dopant region, second dopant region and the remaining portion of the oxide region. In one embodiment, the third etching process can include etching with hydrofluoric acid, an ozone solution, nitric acid, phosphoric acid or combinations thereof. In an embodiment, the third etching process can include performing a buffered oxide etch. FIG. 7, for example, shows a silicon substrate after performing a third etching process to remove the first dopant region, second dopant region and the remaining portion of the oxide region. In one embodiment, the third etching process can include performing a metal clean process to remove contaminants from the silicon substrate and remove the oxide region. In an embodiment, the metal clean process can also etch away the second portion of the oxide region and remove contaminants from the solar cell during processing. In some embodiments, the third etching process allows for performing a metal clean process, e.g., removing contaminants, and removing the oxide region in a single bath. In an embodiment, performing the third etching process can include etching with hydrofluoric acid having a concentration in the range of 0.1-1.5 weight percent (%).

In an embodiment, the solar cell can be dried. For example, the drying process can be performed to remove any remaining moisture from the solar cell. In an embodiment, the drying process can include staging the solar cell in a location to wait for any moisture to dry off. In some embodiments, the drying process can include blowing air on the solar cell to remove any remaining moisture. In an embodiment, the drying process can include slowly removing the solar cells from a hot water, dilute hydrofluoric acid, or mixture of hydrofluoric acid and ozone solution.

At 122, a metal contact region can be formed on the first and second doped regions. In one embodiment, an annealing process, plating process and/or any type of metal formation process can be performed to form the metal contact region on the first and second doped regions. In an embodiment, the metal contact region can allow for the conduction of electrical current from the solar cell to an external circuit.

FIGS. 2-7 illustrate cross-sectional representations of fabricating a silicon solar cell, according to some embodiments.

With reference to FIG. 2, a solar cell is shown after one or more of blocks 100-110 have been performed. In an embodiment, the solar cell 200 can have a front side 204 that faces the sun during normal operation and a back side 202 opposite the front side 204. In one embodiment, the solar cell 200 can include a silicon substrate 210. In an embodiment, the solar cell 200 can also include a first dopant region 223, a second dopant region 224, an oxide region 222 formed on the first dopant region 223. In an embodiment, the first and second dopant regions 223, 224 can include a P-type and N-type dopant, respectively. In some embodiments, the first dopant region 223 can be doped with boron and the second dopant region 224 can be doped with phosphorous. In one embodiment, the second dopant region 224 can be formed over the first dopant region 223, oxide region 222 and the silicon substrate 210. In an embodiment, the oxide region 222 can be an undoped oxide region. In one embodiment, the oxide region 222 can have a thickness in the range of 1000-2500 Angstroms. In some embodiments, an oxide region can also be formed on the second dopant region 224.

In an embodiment, the solar cell 200 can include a silicon region 221 having first and second doped regions 226, 228. In some embodiments, the solar cell 200 can include a dielectric region 230 formed between the silicon region 221 and the silicon substrate 210. In one embodiment, the dielectric region 230 can be an oxide or a tunnel oxide. In an embodiment, the first and second doped regions 226, 228 can be P-type and an N-type doped regions, respectively. In another embodiment, there need not be a silicon region 221 and the first and second doped regions 226, 228 can instead be formed in the silicon substrate 210.

FIG. 3 illustrates the solar cell of FIG. 2 after forming a mask on the second dopant region. In an embodiment, the mask 232 can be an etch resist or an ink. In some embodiments, the mask 232 can be formed by a screen printing process and/or an inkjet process. The mask 232 can be placed over a first portion 224 of the second dopant region, where second portion 225 of the second dopant region can be exposed. In an embodiment, a first etching process (FIG. 1, 112) can be performed to expose a portion of the silicon region 221. In an embodiment, the first etching process can remove a top portion 229 of the first dopant region 222 and the second portion 225 (e.g., exposed portion) of the second dopant region. In some embodiments, the first etching process can etch and/or remove 55-90% of the oxide region 222 (e.g., the top portion 229 of the oxide region can be 55-90% of the oxide region 222). In an embodiment, the top portion 229 can be referred to as a first portion of the oxide region 222. In some embodiments, the top portion 229 can be 600-1900 Angstroms thick. In one embodiment, the first etching process can also expose a portion of the silicon substrate 210. In one embodiment, an etching process with hydrofluoric acid and/or nitric acid can be performed to expose a portion of the silicon region 221, silicon substrate 210 and/or both the silicon region 221 and silicon substrate 210. A subsequent mask removal process (FIG. 1, 114) can remove the mask 232.

With reference to FIG. 4, the solar cell of FIG. 3 is shown after performing the first etching process and mask removal process (FIG. 1, block 112, 114). The solar cell 200 of FIG. 4 can include a remaining portion 231 of the oxide region, an exposed portion 227 of the silicon region 221 and a portion 224 (first portion from FIG. 3) of the second dopant region. In one embodiment, the remaining portion 231 of the oxide region can have a thickness of 200-900 Angstroms after performing the first etching process. In an embodiment, the remaining portion 231 can be referred to as a second portion of the oxide region. In an embodiment, a second etching process (FIG. 1, 116) can be performed to form a trench region, at the exposed portion 227, to separate the first and second doped regions 226, 228. In an embodiment, an alkaline etchant (e.g., potassium hydroxide, sodium hydroxide, tetramethylammonium hydroxide) can be used to etch the silicon substrate and form the trench region. In some embodiments, the trench region can be formed using other techniques (e.g., laser ablation).

FIG. 5 illustrates the solar cell of FIG. 4 after performing a second etching process (FIG. 1, block 116) to form a trench region. In an embodiment, the trench region 240 can electrically separate the first and second doped regions 226, 228. In an embodiment, the trench region 240 can expose a portion the silicon substrate 210. In some embodiments, such as where the first and second 226, 228 doped regions are formed in the silicon substrate 210, the second etching process, and/or forming the trench region 240, need not be performed.

With reference to FIG. 6, the solar cell of FIG. 5 is shown after performing a texturing process (FIG. 1, 118). In an embodiment, a texturing process can be performed to form a textured region 242, 244 on exposed regions, e.g., the trench region 240 and front side 204, of the silicon substrate 210

In an embodiment, a third etching process (FIG. 1, 120) can be performed to remove the remaining portion 231 of the oxide region 222, first dopant region 223 and the remaining portion of the second dopant region 224. In one embodiment, the third etching process can include a metal cleaning process which can remove contaminants from the solar cell 200 and remove the remaining portion 231 of the oxide region 222, first dopant region 223, and the second dopant region 224. In an embodiment, the third etching process can include etching with a mixture of hydrofluoric acid, ozone, and/or hydrochloric acid or combinations thereof. Combining the metal clean and removal of the oxide region can provide several benefits such as reducing the number of etching steps and shortening the process time. Subsequently, a metal contact region and a dielectric region can be formed on the first and second doped regions 226, 228.

FIG. 7 illustrates an example solar cell that results after performing process steps described herein. In an embodiment, the solar cell 200 can have a front side 204 facing the sun during normal operation and a back side 202 opposite the front side 204. In an embodiment, the solar cell 200 can have a silicon substrate 210. The solar cell 200 can also have a first and second doped region 226, 228. In one embodiment, the first and second doped regions 226, 228 can be P-type and N-type doped regions, respectively. In an embodiment, the first and second doped regions 226, 228 can be first and second doped polysilicon regions. In one embodiment, a dielectric region 230 can be formed between the first and second doped regions 226, 228 and the silicon substrate 210. A metal region 250 and a dielectric region 252 can be formed on the first and second doped regions 226, 228. In an embodiment, metal region 250 can include copper, aluminum, tin, among other conductive materials, including non-metals. In some embodiments, the dielectric region 252 can be silicon nitride. A trench region 240 can be formed to separate the first and second doped regions 226, 228. In one embodiment, a trench region 230 need not be formed. In an embodiment, the trench region 240 can have a textured region 242 and the front side 204 of the solar cell 200 can also have a textured region 244.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   forming a silicon region over the silicon substrate;
   forming a first dopant region on the silicon region;
   forming an oxide region on the first dopant region, wherein a first portion of the oxide region protects the first dopant region from a first etching process;
   forming a second dopant region on the silicon region;
   driving dopants from the first and second dopant regions to the silicon region, wherein the driving forms first and second doped regions in the silicon region;
   forming a mask on a first portion of the second dopant region, wherein the mask protects the first portion of the second dopant region from the first etching process;
   performing the first etching process to expose portions of the silicon region and remove a first portion of the oxide region and the mask;
   performing a texturing process to form a textured region on an exposed region of the silicon substrate;
   performing a second etching process to remove the oxide region and contaminants from the silicon substrate; and
   performing a drying process on the silicon substrate.

2. The method of claim 1, wherein performing the first etching process to expose portions of the silicon substrate comprises etching with at least one of hydrofluoric acid and nitric acid.

3. The method of claim 1, wherein performing the second etching process comprises etching with at least one of hydrofluoric acid, ozone or hydrochloric acid.

4. The method of claim 1, wherein forming the second dopant region over the silicon substrate comprises forming the second dopant region over the first dopant region, oxide region and the silicon substrate.

* * * * *